United States Patent [19]

Gupta

[11] 4,382,300

[45] May 3, 1983

[54] METHOD AND APPARATUS FOR DECODING CYCLIC CODES VIA SYNDROME CHAINS

[75] Inventor: Dev V. Gupta, Indianapolis, Ind.

[73] Assignee: Bell Telephone Laboratories Incorporated, Murray Hill, N.J.

[21] Appl. No.: 244,881

[22] Filed: Mar. 18, 1981

[51] Int. Cl.³ .............................................. G06F 11/12
[52] U.S. Cl. ........................................................ 371/37
[58] Field of Search .................................... 371/37, 41

[56] References Cited

U.S. PATENT DOCUMENTS

| | | | |
|---|---|---|---|
| 3,568,148 | 3/1971 | Clark, Jr. | 371/37 |
| 3,671,947 | 6/1972 | Bossen et al. | 371/37 |
| 3,818,442 | 6/1974 | Solomon | 371/37 |
| 4,167,701 | 9/1979 | Kuki et al. | 371/37 |

OTHER PUBLICATIONS

W. Wesley Peterson et al., *Error Correcting Codes,* The Mit Press, 1972, pp. 232–235.

*Primary Examiner*—Jerry Smith
*Attorney, Agent, or Firm*—John K. Mullarney

[57] ABSTRACT

A received cyclic code word is clocked into a first register (11). As soon as the whole received word has been read in, it is parallel-loaded into a storage register (12). The syndrome is then formed (13) of the stored code word. This syndrome is coupled to a logic circuit (14) which determines whether the last stored bit is in error. This decision is modulo-2 added (15) with the last bit, the output being the correct version of the last bit which is then clocked into the input of the storage register. The operation is repeated a given number of times (nt*) at the end of which the maximum likelihood decision on r(x)—the cyclic code word—is present in the storage register (12), ready to be read out.

9 Claims, 19 Drawing Figures

SYNDROME FORMER $$r_i(x) = r_{0i} + r_{1i}x + r_{2i}x^2 + \cdots\cdots + r_{16i}x^{16}$$

$$s(r_i(x)) = s_0 + s_1 x + s_2 x^2 + \cdots\cdots + s_7 x^7$$

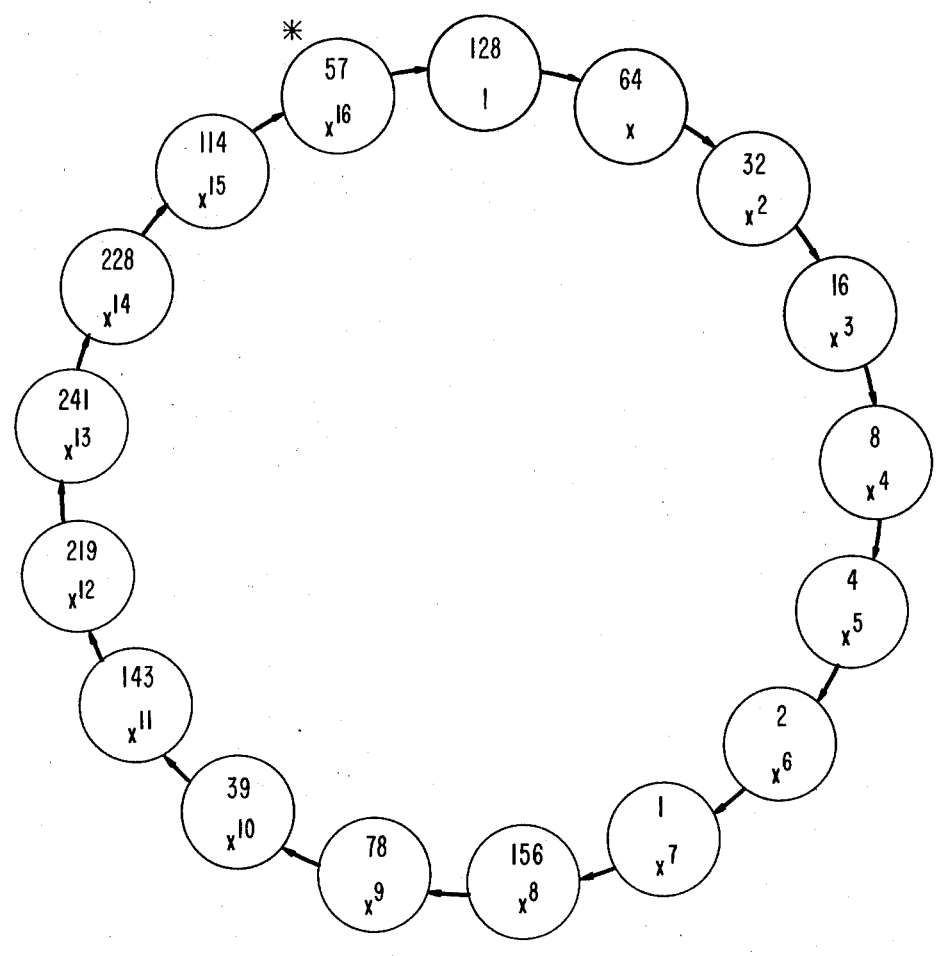
FIG. 4
1st SYNDROME CHAIN
(SINGLE ERROR)
KEY
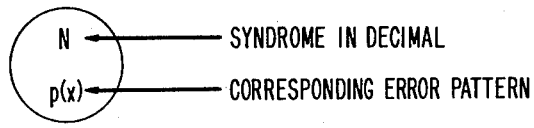
— SYNDROME IN DECIMAL
— CORRESPONDING ERROR PATTERN 2nd SYNDROME CHAIN
(DOUBLE ERROR)

3rd SYNDROME CHAIN
(DOUBLE ERROR)

4th SYNDROME CHAIN
(DOUBLE ERROR)

5th SYNDROME CHAIN
(DOUBLE ERROR)

6th SYNDROME CHAIN
(DOUBLE ERROR)

7th SYNDROME CHAIN
(DOUBLE ERROR)

9th SYNDROME CHAIN
(DOUBLE ERROR)

10th SYNDROME CHAIN
(TRIPLE ERROR)

11th SYNDROME CHAIN
(TRIPLE ERROR)

12th SYNDROME CHAIN
(TRIPLE ERROR)

13th SYNDROME CHAIN
(TRIPLE ERROR)

14th SYNDROME CHAIN
(TRIPLE ERROR)

15th SYNDROME CHAIN
(TRIPLE ERROR)

FIG. 19

$$s(x) = s_0 + s_1 x + s_2 x^2 + \ldots + s_7 x^7$$

| SYNDROME IN DECIMAL | CHAIN | $s_0$ | $s_1$ | $s_2$ | $s_3$ | $s_4$ | $s_5$ | $s_6$ | $s_7$ | $\delta_\xi^*(s(r_i(x)))$ |
|---|---|---|---|---|---|---|---|---|---|---|
| 57  | 1  | 0 | 0 | 1 | 1 | 1 | 0 | 0 | 1 | 1 |
| 75  | 2  | 0 | 1 | 0 | 0 | 1 | 0 | 1 | 1 | φ1 |
| 185 | 2  | 1 | 0 | 1 | 1 | 1 | 0 | 0 | 1 | 1 |
| 221 | 3  | 1 | 1 | 0 | 1 | 1 | 1 | 0 | 1 | 1 |
| 121 | 3  | 0 | 1 | 1 | 1 | 1 | 0 | 0 | 1 | φ1 |
| 200 | 4  | 1 | 1 | 0 | 0 | 1 | 0 | 0 | 0 | 1 |
| 25  | 4  | 0 | 0 | 0 | 1 | 1 | 0 | 0 | 1 | φ1 |
| 226 | 5  | 1 | 1 | 1 | 0 | 0 | 0 | 1 | 0 | 1 |
| 41  | 5  | 0 | 0 | 1 | 0 | 1 | 0 | 0 | 1 | φ1 |
| 182 | 6  | 1 | 0 | 1 | 1 | 0 | 1 | 1 | 0 | 1 |
| 49  | 6  | 0 | 0 | 1 | 1 | 0 | 0 | 1 | 0 | φ1 |
| 30  | 7  | 0 | 0 | 0 | 1 | 1 | 1 | 1 | 0 | 1 |
| 61  | 7  | 0 | 0 | 1 | 1 | 1 | 1 | 0 | 1 | φ1 |
| 119 | 8  | 0 | 1 | 1 | 1 | 0 | 1 | 1 | 1 | 1 |
| 59  | 8  | 0 | 0 | 1 | 1 | 1 | 0 | 1 | 1 | φ1 |
| 165 | 9  | 1 | 0 | 1 | 0 | 0 | 1 | 0 | 1 | φ1 |
| 56  | 9  | 0 | 0 | 1 | 1 | 1 | 0 | 0 | 0 | 1 |
| 186 | 10 | 1 | 0 | 1 | 1 | 1 | 0 | 1 | 0 | φ1 |
| 93  | 10 | 0 | 1 | 0 | 1 | 1 | 1 | 0 | 1 | 1 |
| 89  | 10 | 0 | 1 | 0 | 1 | 1 | 0 | 0 | 1 | φ1 |
| 73  | 11 | 0 | 1 | 0 | 0 | 1 | 0 | 0 | 1 | φ1 |
| 184 | 11 | 1 | 0 | 1 | 1 | 1 | 0 | 0 | 0 | 1 |
| 235 | 11 | 1 | 1 | 1 | 0 | 1 | 0 | 1 | 1 | φ1 |
| 27  | 12 | 0 | 0 | 0 | 1 | 1 | 0 | 1 | 1 | φ1 |
| 172 | 12 | 1 | 0 | 1 | 0 | 1 | 1 | 0 | 0 | φ1 |
| 216 | 12 | 1 | 1 | 0 | 1 | 1 | 0 | 0 | 0 | 1 |
| 161 | 13 | 1 | 0 | 1 | 0 | 0 | 0 | 0 | 1 | φ1 |
| 201 | 13 | 1 | 1 | 0 | 0 | 1 | 0 | 0 | 1 | φ1 |
| 62  | 13 | 0 | 0 | 1 | 1 | 1 | 1 | 1 | 1 | 1 |
| 45  | 14 | 0 | 0 | 1 | 0 | 1 | 1 | 0 | 1 | φ1 |
| 250 | 14 | 1 | 1 | 1 | 1 | 1 | 0 | 1 | 0 | φ1 |
| 162 | 14 | 1 | 0 | 1 | 0 | 0 | 0 | 1 | 0 | 1 |
| 183 | 15 | 1 | 0 | 1 | 1 | 0 | 1 | 1 | 1 | 1 |
| 234 | 15 | 1 | 1 | 1 | 0 | 1 | 0 | 1 | 0 | φ1 |
| 184 | 15 | 1 | 0 | 1 | 1 | 0 | 1 | 0 | 1 | φ1 |

φ1 = 0 or 1 DON'T CARE CONDITION

METHOD AND APPARATUS FOR DECODING CYCLIC CODES VIA SYNDROME CHAINS

TECHNICAL FIELD

This invention relates to error control in data communication systems and, more particularly, to the decoding of cyclic codes which are used for error correction purposes.

BACKGROUND OF THE INVENTION

It has been shown that any linear code (cyclic codes are linear) can be decoded using a table of syndrome vs. error pattern (see, for example, *Error Correcting Codes* by W. W. Peterson et al, The MIT Press (1972), chapter 3). For an (n,k) code, storing the decoding table requires a ROM (read only memory) of size $2^{n-k}$ words each n bits long; for general linear codes this is the only universally applicable technique for decoding. As an example of size, for the (17,9) code generated by $$g(x) = 1 + x^3 + x^4 + x^5 + x^8,$$

the ROM size is given by:

$$r \triangleq n - k = 17 - 9 = 8$$

Hence, ROM size = $2^8 = 256$ words each 17 bits long. Memory size = $256 \times 17 = 4,352$ flip flops.

Cyclic codes are a special variety of linear codes with a lot of algebraic structure. Essentially, all cyclic rotates of any code word are also code words. This permits one to decode these codes more easily than general linear codes. Leaving aside specialized decoders for special cyclic codes, the simplest, generalized, prior art decoding technique applicable to all cyclic codes is the "Meggitt Decoder". This Decoder is shown and described on pages 232-4 of the cited text by W. W. Peterson et al. Details are available in the reference, but the essential idea here is to identify those syndromes the error patterns corresponding to which have degree = $n - 1$. For an (n,k), perfect, t error correcting code, we know:

$$2^{n-k} = \sum_{i=0}^{t} \binom{n}{i} \quad \text{(i)}$$

(ii) The number, $N_M$, of syndromes, the error pattern corresponding to which has degree = $n - 1$, is given by:

$$N_M = \sum_{i=0}^{t-1} \binom{n}{i}.$$

For the (23,12), 3 error correcting perfect Golay Code, $$N_M = 1 + 23 + \frac{23 \times 22}{1 \times 2}$$

$$= 1 + 23 + 253 = 277.$$

This number (277) is also indicative of the number of gates required by the combinatoric logic network of the Meggitt decoder. And while this gating requirement is not onerous in this case, for the more complex cyclic codes, such as (63,39) or (1023,1003) of $t \geq 2$, the number of gates required can number in the tens of thousands or perhaps even millions.

SUMMARY OF THE INVENTION

It is a primary object of the invention to achieve a considerable reduction in the logic implementation of a cyclic code decoder over the Meggitt decoder and the conventional decoding table approach.

In accordance with the invention, a technique is presented for the decoding of cyclic codes which takes advantage of both their group and cyclic properties. This results in a decoder whose complexity is considerably less than that of a decoder implementing the decoding table approach. This technique also shows how, by reducing complexity, various degrees of suboptimum decoding can be done.

Central to the technique is the fact that cyclic rotates of correctable error patterns are correctable error patterns provided they fall in different cosets. This fact allows one to form "chains" of syndromes; and, only one syndrome on each chain (called the "chain leader") and its correctable error pattern needs to be remembered for decoding. Finally based on the fact that error patterns imbedded in correctable error patterns are also correctable, a suitable choice of chain leaders results in totally memoryless decoding. Only some limited combination logic is required for decoding.

In accordance with the present invention, a received cyclic code word is clocked into a first register. As soon as the whole received word has been read in, it is parallel-loaded into a storage register. The syndrome is then formed of the stored code word. This syndrome is coupled to a combinatoric circuit which determines whether the last bit of the stored code word is in error. This decision is modulo-2 added with the last bit, the output being the correct version of the last bit which is then clocked into the input of the storage register. The operation is repeated a given number of times (nt*, or nt' times for suboptimum decoding) at the end of which the maximum likelihood decision on r(x)—the cyclic code word—is present in the storage register, ready to be read out.

It is a particular feature of the invention that for an (n,k) error correcting code, each syndrome chain with a chain leader of Hamming weight $1 \leq t$ has 1 error patterns of degree = $n - 1$. Thus, the number of syndrome chains is strictly less than $N_M$. Consequently, a syndrome chain decoder in accordance with the invention is always simpler (in size of circuit) than a Meggitt decoder. Also, as will be evident hereinafter, some "don't care" conditions become available making the syndrome chain decoder simpler still.

BRIEF DESCRIPTION OF THE DRAWING

The invention will be fully appreciated from the following detailed description when the same is considered in connection with the accompanying drawings in which:

FIGS. 4–18 are syndrome chain diagrams useful in understanding the principles of the present invention; and FIG. 19 shows a table which illustrates the function of the block in FIG. 1 labelled $\delta_\xi^*(s(r_i(x)))$.

DETAILED DESCRIPTION

Figure 1:
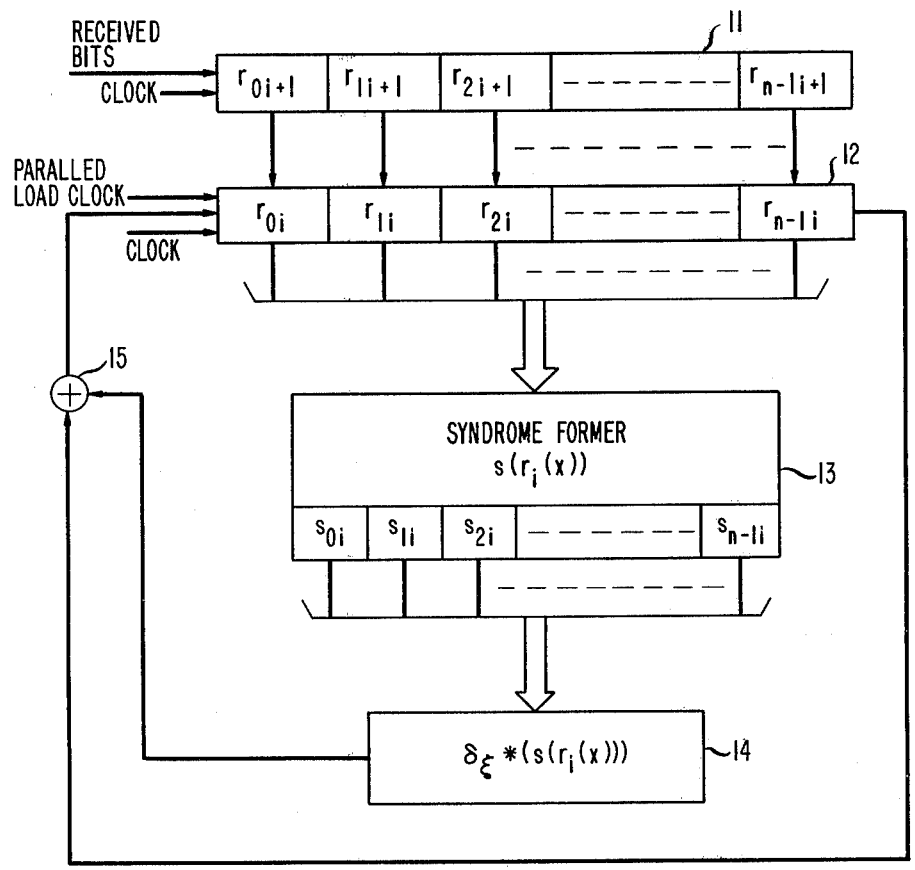
FIG. 1 is a simplified block diagram of a decoder for cyclic codes constructed in accordance with the principles of the present invention.

A brief introduction into cyclic code theory at this point may facilitate an understanding of the mathematical analysis that follows. An (n,k) cyclic code, C, generated by the polynomial g(x) is the set all polynomial multiples of g(x) reduced modulo $x^n+1$. Further, $$r \triangleq \deg g(x) = n-k, \quad (1)$$

$$\exists h(x) \ni g(x)h(x) = x^n+1. \quad (2)$$

It can be shown that the code C has exactly $2^k$ elements all of whom satisfy, $$\forall c(x) \in C \; \exists a(x) \ni c(x) = a(x)g(x) \quad (3)$$

and a(x) is polynomials of degree $\leq k-1$.

Also in view of equation 2 it can be shown that all cyclic rotates of code words are code words.

In view of equation 3, one can contend that the polynomial p(x) of degree $\leq n-1$, is a code word if p(x) is exactly divisible by g(x). One possible encoding procedure is then suggested by equation 3 and the feasibility of polynomial multiplication by feedback shift registers. Another popular encoding procedure is to form the code word $c_a(x)$ corresponding to the information polynomial a(x) as, $$c_a(x) = x^r a(x) \bmod g(x) + x^r a(x). \quad (4)$$

It is readily seen that $c_a(x)$ is exactly divisible by g(x) and $\deg c_a(x) = r + \deg a(x) \leq r+k-1 = n-1$. The advantage of encoding as in equation (4) is that the first r digits of $c_a(x)$ {corresponding to $x^r a(x) \bmod g(x)$} constitute the parity bits and the last k digits {corresponding to $x^r a(x)$} are exactly the information bits.

Definition:

By $\pi_m$ we denote the space of all polynomials of degree $\leq m$.

Before addressing the decoding operation, consider the following algebraic construction. Let $S \triangleq \{s_0(x), s_1(x), \ldots, s_{2^r-1}(x)\}$ be the set of the $2^r$ polynominals of degree $\leq r-1$, i.e., $S \equiv \pi_{r-1}$.

Definition:

The residue class $\text{IR}(s_i(x))$ corresponding to the polynomial $s_i(x) \in S$, is the set of all polynomials $p_{ij}(x) \in \pi_{n-1}$ which satisfy, $$p_{ij}(x) \bmod g(x) = s_i(x). \quad (5)$$

Let $\{\text{IR}(s_i(x)); i=0,1,2, \ldots 2^r-1\}$ be the super set of residue classes corresponding to the elements of S.

Definition:

The Hamming weight of a polynomial p(x), denoted by $W_H p(x)$ is defined to be, $$W_H p(x) \triangleq p(1) \quad (6)$$

It is readily seen that $W_H p(x)$ is the same as the Hamming weight of the binary sequence corresponding to p(x). Now as part of our construction we identify $e_i^*(x) \in \text{IR}\{s_i(x)\}$ $$\text{Min} \; \{W_H p_{ij}(x)\} = W_H e_i^*(x); \quad (7)$$
$$p_{ij}(x) \in \text{IR}(s_i(x))$$

$$\forall i \in \{0,1,2 \ldots 2^r-1\}$$

Now consider the decoding problem, say one received $r_i(x)$ upon transmitting the code word $c_j(x)$. Obviously $$r_i(x) = c_j(x) \oplus e(x), \quad (8)$$

where e(x) is the error polynomial. The decoding problem is to make a maximum likelihood decision on e(x).

From equations 3 or 4 one notes that $$s_i(x) \triangleq r_i(x) \bmod g(x) = e(x) \bmod g(x) \quad (9)$$

Thus, $s_i(x)$ is totally a function of the error polynomial e(x) and has nothing to do with which $c_j(x) \in C$ was actually transmitted. Now obviously any element $p_{ij}(x) \in \text{IR}(s_i(x))$ is a candidate for e(x). In fact only elements of $\text{IR}(s_i(x))$ are candidates for e(x). Using the theorem that when transmission is over a Binary Symmetric Channel (BSC), the most likely error pattern is the one with minimum Hamming weight, one concludes that the maximum likelihood decision on e(x) is, $$\hat{e}(x) \triangleq e_i^*(x) \in \text{IR}(s_i(x)) \quad (10)$$

Obviously, an error is made if $$e_i^*(x) - e(x) \neq 0, \quad (11)$$

but as $e_i^*(x) - e(x) \in C$ as both are in $\text{IR}(s_i(x))$, inequality 11 happens with low probability as every element in C has at least $d_{min}$ Hamming Weight, where $d_{min} \triangleq$ minimum distance of the code C and is $\geq 3$ if the code corrects at least one error.

The polynomial, $s_i(x)$ is called the syndrome corresponding to $r_i(x)$ and more formally denoted by $s(r_i(x))$. The set $\text{IR}(s_i(x))$ is called the coset corresponding to $s_i(x)$ and $e_i^*(x)$ is called the coset leader of $\text{IR}(s_i(x))$. The set $E \triangleq \{e_i^*(x); i=0,1,2 \ldots 2^r-1\}$ is called the set of correctable error patterns. If all polynomials p(x) of degree $\leq n-1$ and Hamming weight $\leq t$ are present in E and t is the maximum such integer, then the code is said to be t-error correcting and it can be shown that, $$t = \left\lfloor \frac{d_{min}-1}{2} \right\rfloor \quad (12)$$

where [b] means the maximum integer less than b.

Before entering into the discussion on syndrome chains, some theory has to be developed.

Definition:

Given $p(x) \in \pi_{n-1}$, the operation f acting on p(x) cyclically shifts p(x) one right, i.e.

$$fp(x) = xp(x) \bmod (x^n+1) \quad (13)$$

The fact that the R.H.S. of equation 13 corresponds to cyclically shifting p(x) one right is readily proved.

Definition:

$$f^i p(x) \triangleq x^i p(x) \bmod (x^n+1), \quad (14)$$

corresponds to cyclically shifting p(x), i times to the right.

Definition:

$f^{-i}p(x)$ corresponds to cyclically shifting $p(x)$, $i$ times to the left, i.e.

$$f^{-i}p(x) = x^{mn-i}p(x) \bmod g(x) \qquad (15)$$

where $i = (m-1)n + j$ and $j = i \bmod n$.

It is readily shown that $f^i(f^{-i})$ is an associative operation, i.e. cyclically rotating the sum of two polynomials $i$ bits to the right (left) is equivalent to rotating the two polynomials $i$ bits to the right (left) and then summing them up.

Lemma 1:

$$f^i(p_1(x) \oplus p_2(x)) = f^i p_1(x) \oplus f^i p_2(x) \qquad (16)$$

given $\deg p_1(x) \leq n - 1$ and $\deg p_2(x) \leq n - 1$.

The proof is trivial and has already been stated in words before the lemma was stated.

Definition:

The syndrome of a polynomial $p(x) \in \pi_{n-1}$ is defined to be $s(p(x))$, i.e., $$s(p(x)) = p(x) \bmod g(x) \qquad (17)$$

Theorem 1:

If $s(p_1(x)) = s(p_2(x))$ for $p_1(x)$ and $p_2(x) \in \pi_{n-1}$ then, $$s(f^i p_1(x)) = s(f^i p_2(x)) \text{ for } i \in \{\ldots -2, -1, 0, 1, 2, \ldots\}.$$

Proof:

Since $s(p_1(x)) = s(p_2(x))$

Hence, $s(p_1(x) \oplus p_2(x)) = 0$ $\rightarrow p_1(x) \oplus p_2(x) \in C$

Therefore, $f^i(p_1(x) \oplus p_2(x)) \in C$ as $C$ is cyclic.

From Lemma 1 the L.H.S. of the above equation becomes, $$f^i p_1(x) \oplus f^i p_2(x) \in C$$

Therefore $s(f^i p_1(x) \oplus f^i p_2(x)) = 0$ $\rightarrow s(f^i p_1(x)) = s(f^i p_2(x))$ Theorem 2:

The sequence $s(p(x)), s(fp(x)), s(f^2 p(x)) \ldots, s(f^i p(x)), \ldots$ is periodic with period $L \leq n$ and $n \bmod L = 0$.

Proof:

$$\because f^n p(x) = p(x),$$

therefore, the sequence is definitely periodic with period $n$. But if the sequence has minimum period $L < n$ then all that need be proved is that $$s(f^L p(x)) = s(f^i p(x))$$

iff $i = 0$. Then, from Theorem 1 we can guarantee periodicity with period $L$. Say, $i \neq 0$, then from Theorem 1, $$s(f^{L-i} p(x)) = s(p(x))$$

and hence the sequence will be periodic with period $L - i < L$ as $i > 0$. But, by definition $L$ is the minimum period, hence $i = 0$ is the only possibility. Finally, since the sequence is also periodic with period $n$, $n \bmod L = 0$.

Definition:

(1) The sequence $\alpha(p(x))$, $p(x) \in \pi_{n-1}$ corresponds to, $$\alpha(p(x)) \triangleq \{p(x), fp(x), f^2 p(x), \ldots\} \qquad (19)$$

(2) The sequence $\beta(p(x))$ corresponds to, $$\beta(p(x)) = \{s(p(x)), s(fp(x)), s(f^2 p(x)), \ldots\} \qquad (20)$$

(3) If $L$ is the period of the periodic sequence $\beta(p(x))$ (from Theorem 2) then, $$\text{Per } \beta(p(x)) \triangleq L \qquad (21)$$

Theorem 3:

Let $e^*(x) \in E$ then any $L$ consecutive elements of $\alpha(e^*(x))$ are also in $E$, where $L = \text{Per } \beta(e^*(x))$.

Proof:

It should be enough to prove that the first $L$ elements of $\alpha(e^*(x))$ are in $E$, then from periodicity of $\beta(e^*(x))$ the above theorem should follow.

As a first step note that, $$W_H p(x) = W_H f^j p(x); \forall j \in \{\ldots -2, -1, 0, 1, 2, \ldots\} \qquad (22)$$

Now let for some $i \in \{1, 2, \ldots L - 1\}$, $$f^i e^*(x) \notin E \qquad (23)$$

Then, $\exists \, e'(x) \in E \ni W_H e'(x) < W_H f^i e^*(x) \qquad (24)$ and $s(e'(x)) = s(f^i e^*(x)) \qquad (25)$ From Theorem 2, $$s(f^{-i} e'(x)) = s(e^*(x)) \qquad (26)$$

From equation 22, $$W_H f^{-i} e'(x) = W_H e'(x) < W_H f^i e^*(x) = W_H e^*(x)$$

i.e.

$$W_H f^{-i} e'(x) < W_H e^*(x) \qquad (27)$$

From inequality (27) and equation (26) we conclude that $$e^*(x) \notin E$$

But by definition $e^*(x) \in E$ and hence $$f^i e^*(x) \in E \text{ for } i = 0, 1, 2, \ldots L - 1.$$

Definition:

The set $\xi(e^*(x))$ containing any $L$ consecutive elements of $\beta(e^*(x))$ is called the syndrome chain corresponding to the chain leader $s(e^*(x))$.

Theorem 4:

Any syndrome on $\xi(e^*(x))$ can be chosen as the chain leader.

Proof:

From Theorem 2 on periodicity of $\beta(e^*(x))$, it becomes clear that $$\xi(e^*(x)) = \xi(f^i e^*(x)), \qquad (28)$$

for any $i \in \{0, 1, 2, \ldots L - 1\}$.

Theorem 5:

Two distinct syndrome chains are disjoint.

Proof:

Consider two syndrome chains $\xi(e_1^*(x))$ and $\xi(e_2^*(x))$ such that $$\xi(e_1^*(x)) \neq \xi(e_2^*(x)) \tag{29}$$

Let the set D be defined as, $$D \triangleq \xi(e_1^*(x)) \cap \xi(e_2^*(x)) \tag{30}$$

We need to prove $D = \{\emptyset\}$ where $\{\emptyset\}$ is the null set. Let $D \neq \{\emptyset\}$, then,
$\exists\ s(e(x)) \in D$ satisfying, $$\begin{cases} s(e(x)) \in \xi(e_1^*(x)) \\ s(e(x)) \in \xi(e_2^*(x)). \end{cases} \tag{31}$$

Thus, from Theorem 4, $$\begin{cases} \xi(e(x)) = \xi(e_1^*(x)) \\ \xi(e(x)) = \xi(e_2^*(x)) \end{cases} \tag{32}$$

$$\longrightarrow \xi(e_1(x)) = \xi(e_2^*(x))$$

which is a contradiction of assumption (29). Hence $D = \{\emptyset\}$.

The analysis can now turn to the decoding via syndrome chains.

Let $\xi(e_1^*(x)), \xi(e_2^*(x)), \ldots, \xi(e_J^*(x))$ be J distinct syndrome chains for a code with generator polynomial $g(x)$. Also J is such that, $$\bigcup_{i=1}^{J} \xi(e_i^*(x)) = \pi_{r-1} \tag{33}$$

∵ From Theorem 5

$$\xi(e_i^*(x)) \cap \xi(e_j^*(x)) = \{\emptyset\} \text{ for } i \neq j \tag{34}$$

$$\therefore \left\| \bigcup_{i=1}^{J} \xi(e_i^*(x)) \right\| = \sum_{i=1}^{J} \|\xi(e_i^*(x))\|$$

$$= \|\pi_{r-1}\| = 2^r,$$

i.e., J is such that the different $\xi(e_i^*(x))$; $i = 1, 2, \ldots J$; are mutually disjoint and totally exhaust the set of all possible syndromes. Now form the two ordered sets, $$\xi^o \triangleq \{s(e_1^*(x)), s(e_2^*(x)), \ldots, s(e_J^*(x))\} \tag{35}$$

$$E^o \triangleq \{e_1^*(x), e_2^*(x), \ldots, e_J^*(x)\} \tag{36}$$

Consider the following decoding procedure:
(1) Received $$r(x) = \hat{c}(x) \oplus e^*(x) \tag{37}$$

where $\hat{c}(x) \in C$ and $e^*(x) \in E$ are as yet unknown.
(2) Set $i = -1$.
(3) Set $i = +1$; form $s(f^i r(x))$.
(4) Check to see if $s(f^i r(x)) \in \xi^o$.
If it is then go to step 5. Else return to step 3.
(5) If $s(f^i r(x))$ is the jth element of $\xi^o$ set $f^i e^*(x) = e_j^*(x)$.
(6) Form $\hat{c}(x) = r(x) \oplus f^{-i} e_j^*(x)$.

Theorem 6:

The maximum number of step 3, step 4 loopings before escaping to step 5, is n.

Proof:

$$\begin{aligned} r(x) &= c(x) + e^*(x)\ s(f^i r(x)) = s(f^i c(x)) \oplus s(f^i e^*(x)) \\ &= s(f^i e^*(x));\ i = 0, 1, 2, \ldots \end{aligned} \tag{38}$$

as the code is cyclic.

Now as i goes from 0 to $n-1$, $s(f^i e^*(x))$ must go completely thru the syndrome chain with $s(e^*(x))$ in it. Since at least one element of each syndrome chain is in $\xi^o$, hence, for some $i \in \{0, 1, 2, \ldots n-1\}$, there must be an escape from step 4 to step 5.

Theorem 7

The choice $\hat{c}(x) = r(x) \oplus f^i e_j^*(x)$ is maximum likelihood.

Proof:

Let $\|\xi(e^*(x))\| = L$

Then Theorem 6 is readily extended to prove that for some $i \in \{0, 1, \ldots L-1\}$, there would be an escape from step 4 to step 5.

$$\therefore e_j^*(x) \in E$$

∴ From Theorem 3, $$f^{-i} e_j^*(x) \in E \text{ for } i \in \{0, 1, 2 \ldots L-1\} \tag{39}$$

Also, from the algorithm $$s(f^i r(x)) = s(e_j^*(x)) \tag{40}$$

∴ From Theorem 1, $$\begin{aligned} s(r(x)) &= s(f^{-i} e_j^*(x)) \\ \therefore s(\hat{c}(x)) &= s(r(x)) \oplus s(f^{-i} e_j^*(x)) = 0 \rightarrow \hat{c}(x) \in C \end{aligned} \tag{41}$$

From equations 41 and 39 we conclude that $\hat{c}(x)$ is a maximum likelihood decision on $r(x)$.

Now, note that in general as $J < 2^r$ and $$\|\xi_o\| = \|E_o\| = J < 2^r \tag{42}$$

and hence less memory is required to do decoding using the previously outlined algorithm then straight syndrome error pattern table look up (which has $2^r$ memory requirement).

Theorem 8A:

If n is prime then $J = (2^r - 1)/n$.

Proof:

If n is prime then each syndrome chain has exactly n elements as, from Theorem 2, $$n \bmod L = 0$$

is satisfied if $L = n$.

There are $2^r - 1$ non-zero syndromes and since syndrome chains are disjoint, there are exactly $(2^r - 1)/n$ chains.

Theorem 8B:

$$J = (2^r - 1)/n$$

Proof: Is readily obvious.

Considering now no memory decoding via syndrome chains, the chain leaders $e_1^*(x), e_2^*(x), \ldots, e_J^*(x)$, of the previous section were chosen randomly as any member of the chains $\xi(e_1^*(x)), \xi(e_2^*(x)), \ldots, \xi(e_J^*(x))$, respectively. Suppose we do the following construction, (1) Identify $$e_j'(x); j=1,2,\ldots J \ni s(e_j'(x)) \epsilon \xi(e_j^*(x)) \tag{43}$$

and, $$\deg e_j'(x) = n-1, \tag{44}$$

i.e., the last bit of $e_j'(x)$ is a one. It becomes readily obvious that at least one such $e_j'(x)$ exists in $\alpha(e_j'(x))$ e.g. one possible choice is $$e_j'(x) = f^{n-1-\deg e_j^*(x)} e_j^*(x) \tag{45}$$

(2) From Theorem 4, $$\xi(e_j^*(x)) = \xi(e_j'(x)) \tag{46}$$

and from Theorem 3, $$e_j'(x) \epsilon E \text{ as } e_j^*(x) \epsilon E. \tag{47}$$

Finally, form the set $$\xi^* \underline{\Delta} \{s(e_j'(x); j=1,2,\ldots J\}. \tag{48}$$

(3) Now form the function, $$\delta \xi^*(p(x)) = \begin{cases} x^{n-1} & \text{iff } p(x) \epsilon \xi^* \\ \emptyset & \text{otherwise} \end{cases} \tag{49}$$

(4) Finally let, $$t^* = \underset{j=1,2,\ldots J}{\text{Max}} \{W_H e_j^*(x)\} \tag{50}$$

The decoding algorithm to be developed rests on the following theorem:
Theorem 9:

Let $e'(x) \epsilon E$ and let $\deg e'(x) = x^{n-1}$, then $$e''(x) \underline{\Delta} e'(x) \oplus x^{n-1} \tag{51}$$

satisfies, $e''(x) \epsilon E.$

Proof:
Note that, $$W_H e'(x) = W_H e''(x) + 1 \tag{52}$$

and $$s(e'(x)) = s(e''(x)) \oplus s(x^{n-1}) \tag{53}$$

Now if $e''(x) \notin E$ then $\exists e'''(x) \epsilon E \ni$ $$s(e'''(x)) = s(e''(x)) \tag{54}$$

and $$W_H e'''(x) < W_H e''(x). \tag{55}$$

From equations 53 and 54, $$s(e'(x)) = s(e'''(x) \oplus x^{n-1}) \tag{56}$$

and from the triangle inequality $$W_H(e'''(x) \oplus x^{n-1}) \leq W_H e'''(x) + 1 \tag{57}$$

finally from inequality 55

$$W_H e'''(x) + 1 < W_H e''(x) + 1 = W_H e'(x). \tag{58}$$

From inequalities 57 and 58, $$W_H(e'''(x) \oplus x^{n-1}) < W_H e'(x) \tag{59}$$

Finally from equation 56 and inequality 59, one concludes, $e'(x) \notin E$ which is a contradiction. Thus, $e''(x) \epsilon E$.

Now consider the following decoding algorithm:
(1) Received, $r(x) = \hat{c}(x) + e^*(x)$; $e^*(x) \epsilon E$ is as yet unknown.
(2) Set $i = -1$, $r_0(x) = r(x)$.
(3) $i = i+1$.
(4) Form $p(x) = s(f^i r_i(x))$ and determine $\delta \xi^*(p(x))$.
(5) Form $r_{i+1}(x) \underline{\Delta} r_i(x) \oplus \delta \xi^*(p(x))$.
(6) If $i < t^*n$ then returns to step 3.
(7) Set $\hat{c}(x) = r_i^* n(x)$.
Theorem 10:
The decision $\hat{c}(x)$ of the previous decoding method is maximum likelihood.
Proof:

(1) Let $r(x) = c(x) \oplus e^*(x) \quad c(x) \epsilon C \text{ and } e^*(x) \epsilon E.$ (2) Let $W_H e^*(x) = \gamma \leq t^*$ (3) Let $s(e^*(x)) \epsilon \xi(e_j'(x))$ for some $j \epsilon \{1,2\ldots J\}$.
(4) Let $L_j = \| \xi(e_j'(x)) \|$ (5) Then there exists an integer $m \epsilon 0,1,2,\ldots L_{j-1}$ such that $e_j'(x) = f^m e^*(x)$ also, since $L_j \leq n$ (from Theorem 2)

$\therefore m \leq n$ (6) Hence, $$\begin{aligned} r_m(x) &= f^m r(x) \\ &= f^m c(x) \oplus f^m e^*(x) \\ &= c'(x) \oplus e_j'(x) \end{aligned}$$

where $c'(x)\epsilon C$ and $e_j'(x)\epsilon E$ (7)
$$s(r_m(x)) = s(e_j'(x))\epsilon\xi^*$$
$$\therefore \delta_\xi^*(s(r_m(x))) = x^{n-1}$$

(8)
$$r_m(x) = c'(x) \oplus e_j''(x) + x^{n-1}$$

where, $e_j(x) = e_j''(x) \oplus x^{n-1}$ (9)
$$r_{m+1}(x) = fc'(x) \oplus e_j''(x) \oplus x^{n-1} \oplus \delta_\xi^*(s(r_m(x)))$$
and $\delta_\xi^*(s(r_m(x))) = x^{n-1}$
$$\therefore r_{m+1}(x) = fc'(x) + e_j''(x)$$

(10) From Theorem 9, $$e_j''(x)\epsilon E$$

and $W_H e_j''(x) = W_H e_j'(x) - 1$

(11) Thus after $m<n$ cyclic shifts the Hamming weight of the error pattern for sure reduces by 1 and exactly one error is corrected.

(12) Thus after $\gamma n$ cyclic shifts the weight of the error pattern left is $\emptyset$ and no further errors are corrected as $s(\emptyset) = 0 \ \epsilon\xi^*$.

(13)
$$\therefore \gamma \leq t^*$$
$$\therefore \gamma n \leq t^* n$$

that after $t^* n$ cyclic shifts all errors been reduced to weight zero.

(14) Since exactly $\gamma$ errors are corrected and the syndrome reduced to zero, hence the results is maximum likelihood.

In conclusion, note that the functions $\delta_\xi^*(\cdot)$ can be built by some amount of combinatoric logic and hence no memory is required. Also, one suboptimum decoding strategy is to form a set, $$\xi^{**} \supset \xi^* \text{ such that any}$$
$$e'(x)\epsilon\{\xi^* - \xi^{**}\}\text{satisfies}$$
$$W_H e'(x) > t' \leq t^*,$$

and using the function, $$\delta_{\xi^{}}(p(x)) = \begin{cases} x^{n-1} & \text{iff } p(x) \ \epsilon \ \xi^{} \\ \emptyset & \text{otherwise} \end{cases}$$

instead of $\delta_{86}^*(\cdot)$ in the above algorithm. Then any error of weight $>t'$ will not be corrected after decoding, however, it should be readily evident that any error of weight $\leq t'$ will be corrected. Thus bounded distance decoding can be simply done using this technique.

Figure 2:
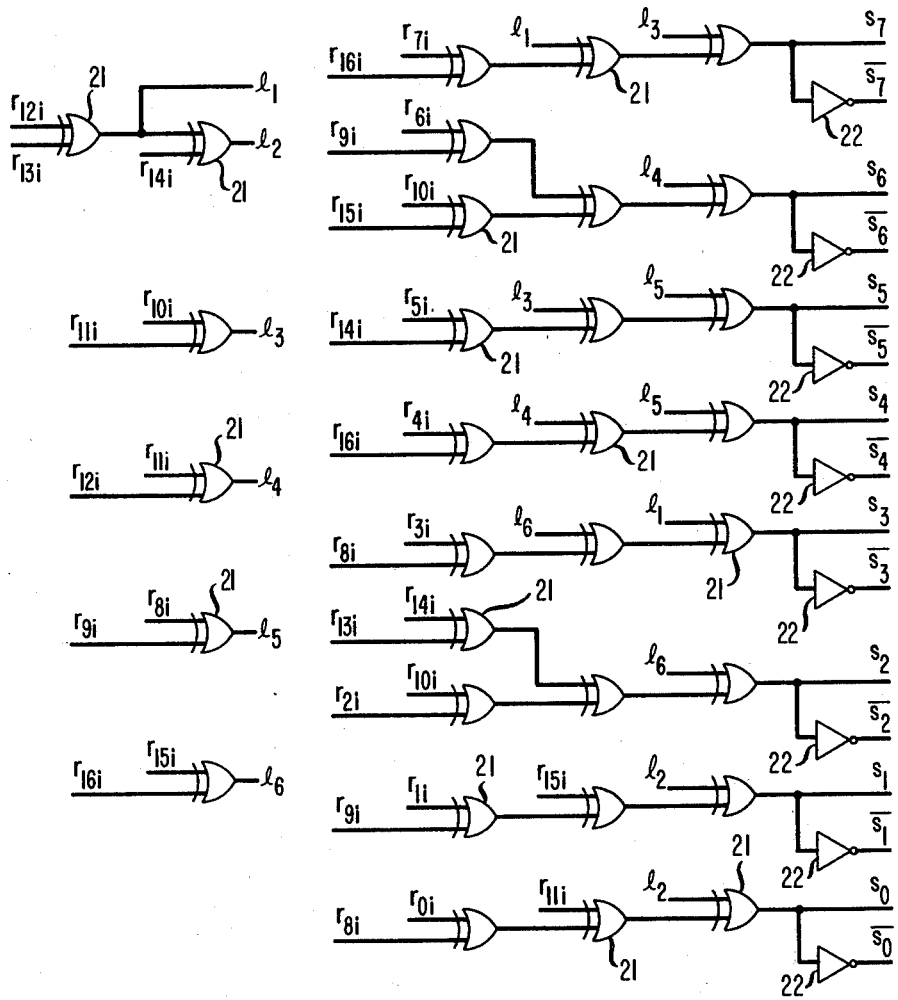
FIG. 2 is a detailed schematic diagram of the syndrome former of FIG. 1.

Turning now to FIG. 1 of the drawings, there is shown a decoder for cyclic codes in accordance with the present invention. For purposes of illustration, it will be assumed that the incoming received bits were encoded in accordance with the (17, 9) 2-QP cyclic code generated by $g(x) = 1 + x^3 + x^4 + x^5 + x^8$. The received bits are clocked into the register 11 in a conventional manner. As soon as a whole received code word (17 bits) has been read in, it is parallel-loaded into storage register 12. The parallel output ($r_i(x)$) of the storage register is coupled to the syndrome former 13, which as the name implies forms the syndrome of the stored code word. If there is no error in the code word, the syndrome former of course provides no meaningful output ($s(x) = 0$). As shown in FIG. 2, applicant has implemented the syndrome former 13 using only combinational logic, rather than the feedback shift register approach of the Meggitt decoder. The logic of FIG. 2 consists of a plurality of exclusive-OR gates 21, connected in a tree-like configuration, and output inverters 22. Since the function of an exclusive-OR gate is well known, a detailed explanation of the operation of the FIG. 2 circuit would not appear necessary; it is essentially self-explanatory. It should be appreciated that the syndrome former logic circuit of FIG. 2 forms the requisite syndrome(s) for, and only for, the (17, 9) cyclic code. For other and different cyclic codes the combinational logic of the syndrome former 13 would, of course, be different—i.e., a different configuration of exclusive-OR gates. However, given the foregoing mathematical analysis it is within the skill of one in the art to design the requisite syndrome logic circuit for other and different cyclic codes.

Figure 3:
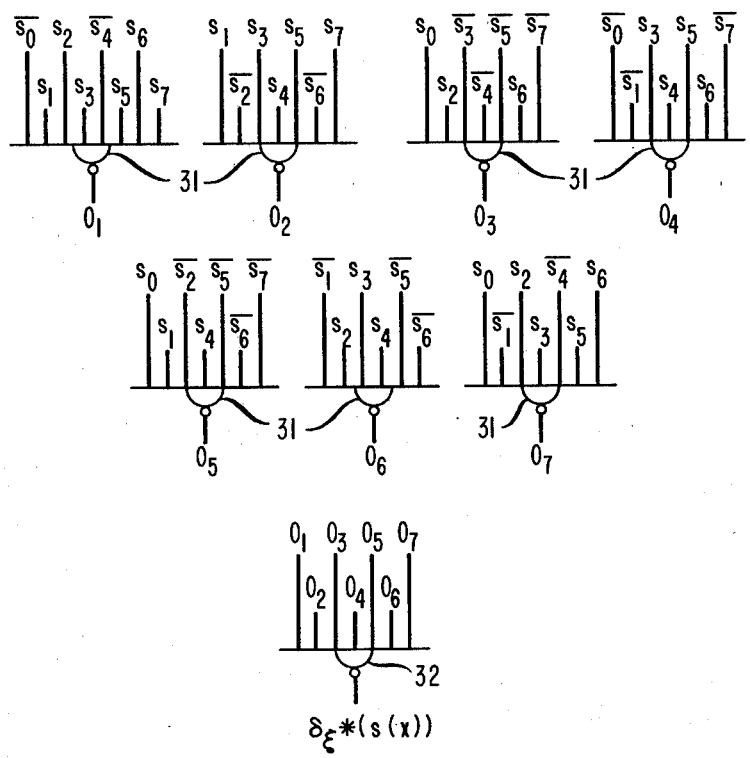
FIG. 3 is a detailed schematic diagram of the block of FIG. 1 labelled $\delta_\xi^*(s(r_i(x)))$.
Figure 5:
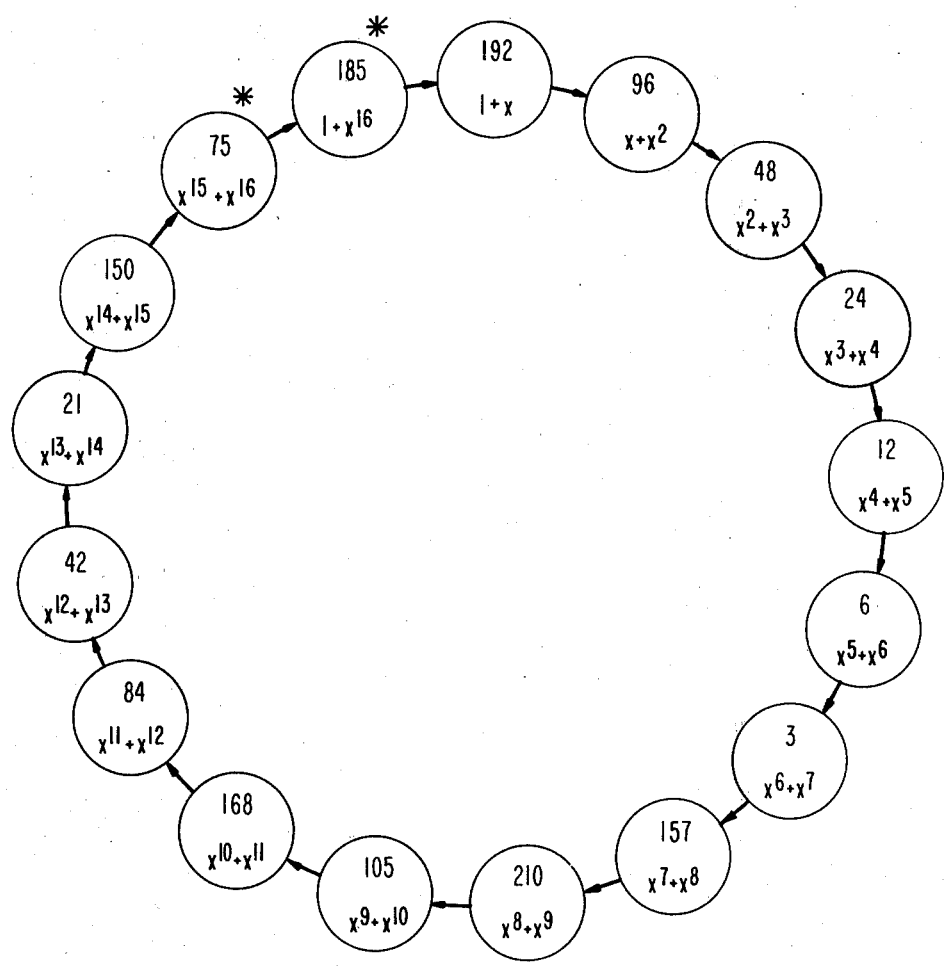
Figure 6:
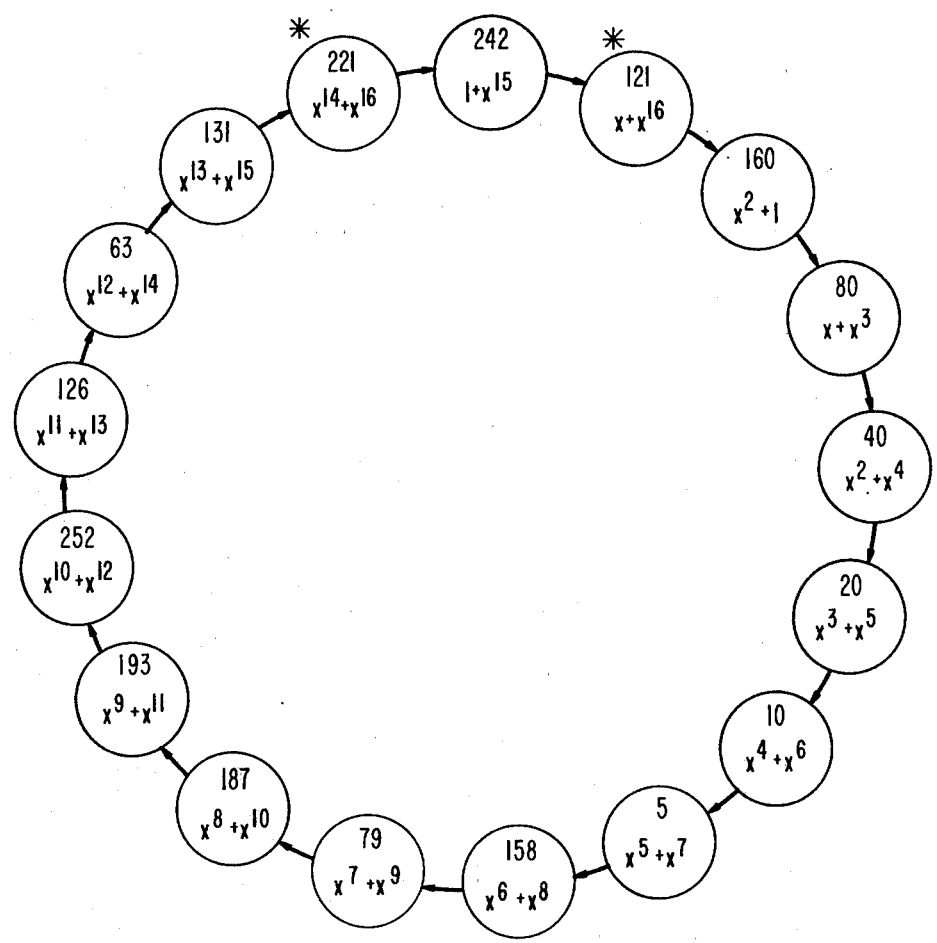
Figure 7:
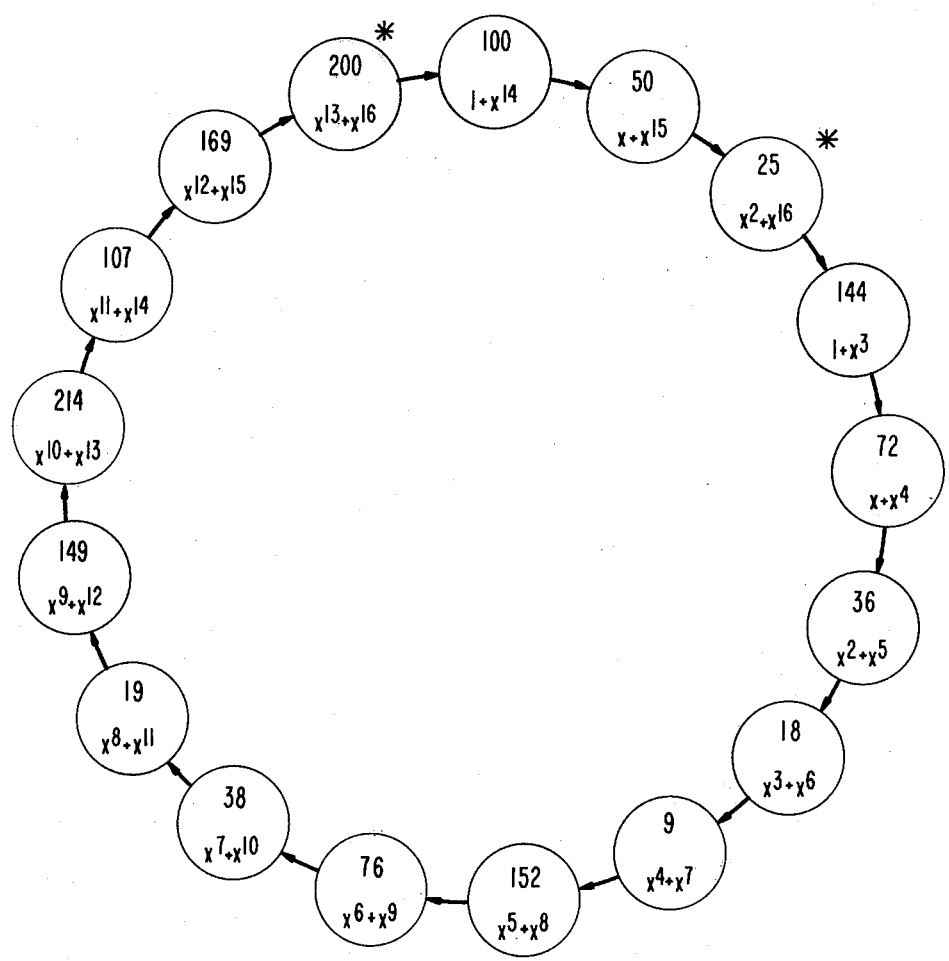
Figure 8:
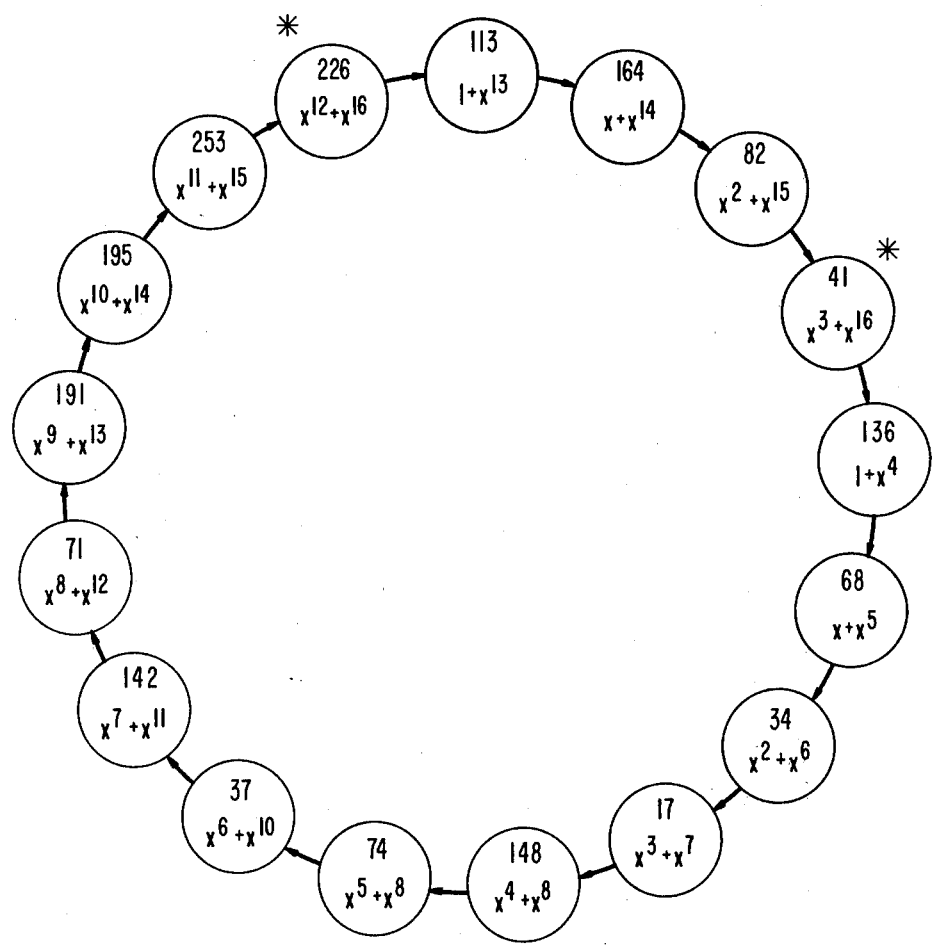
Figure 9:
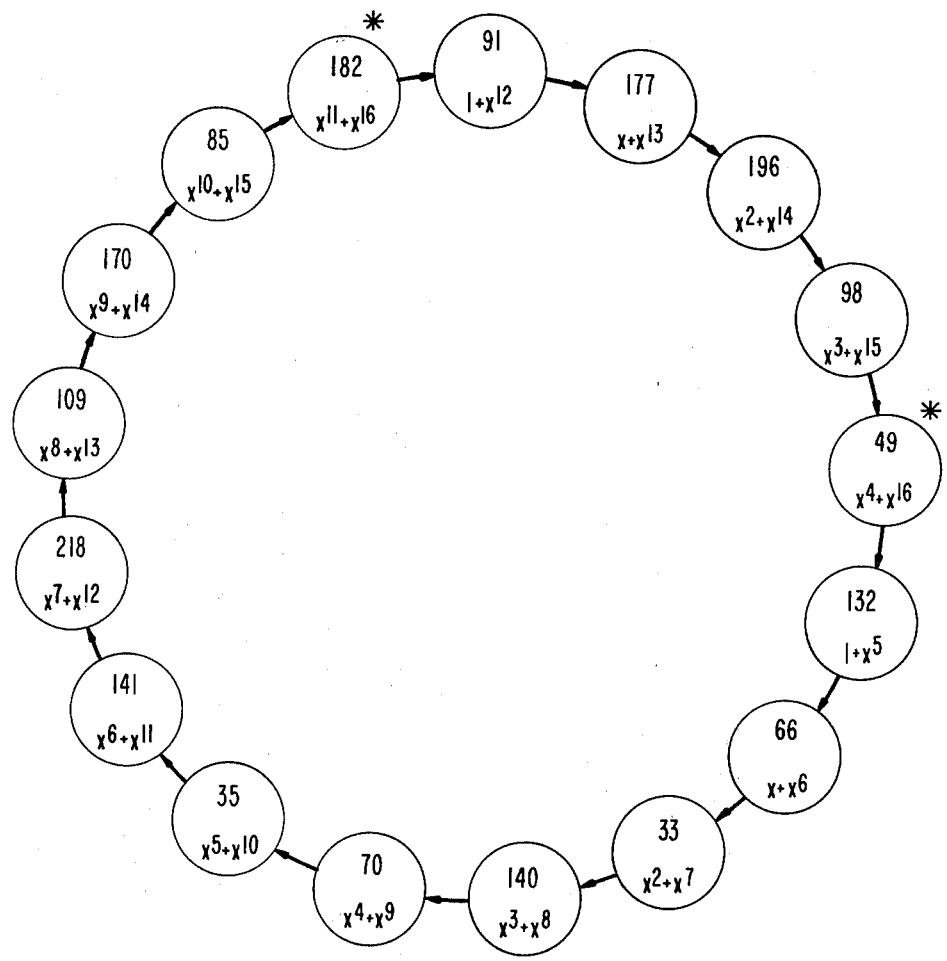
Figure 10:
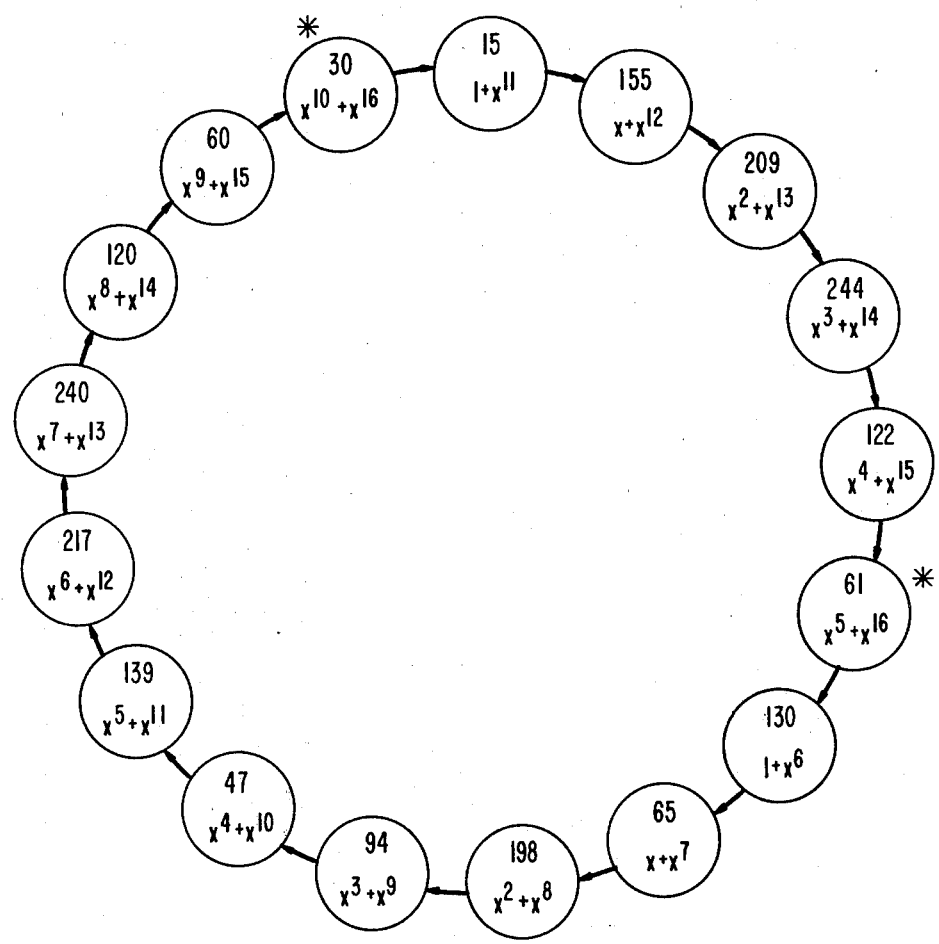
Figure 11:
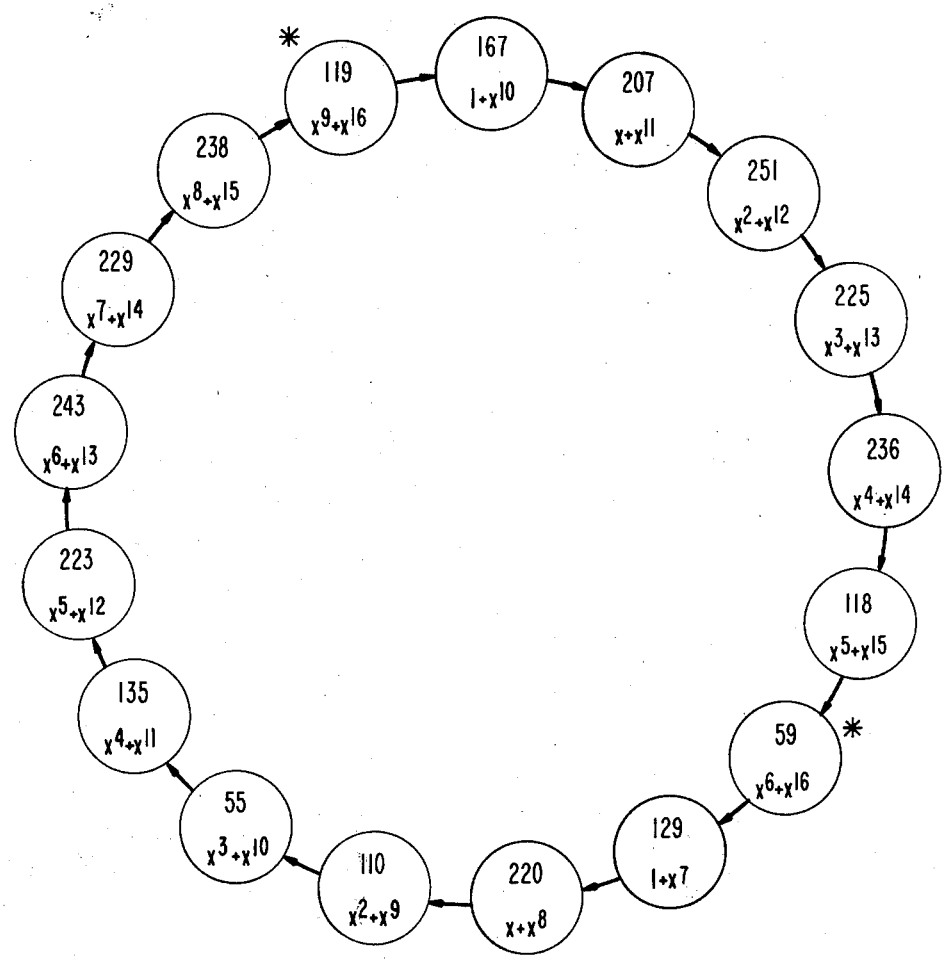
Figure 12:
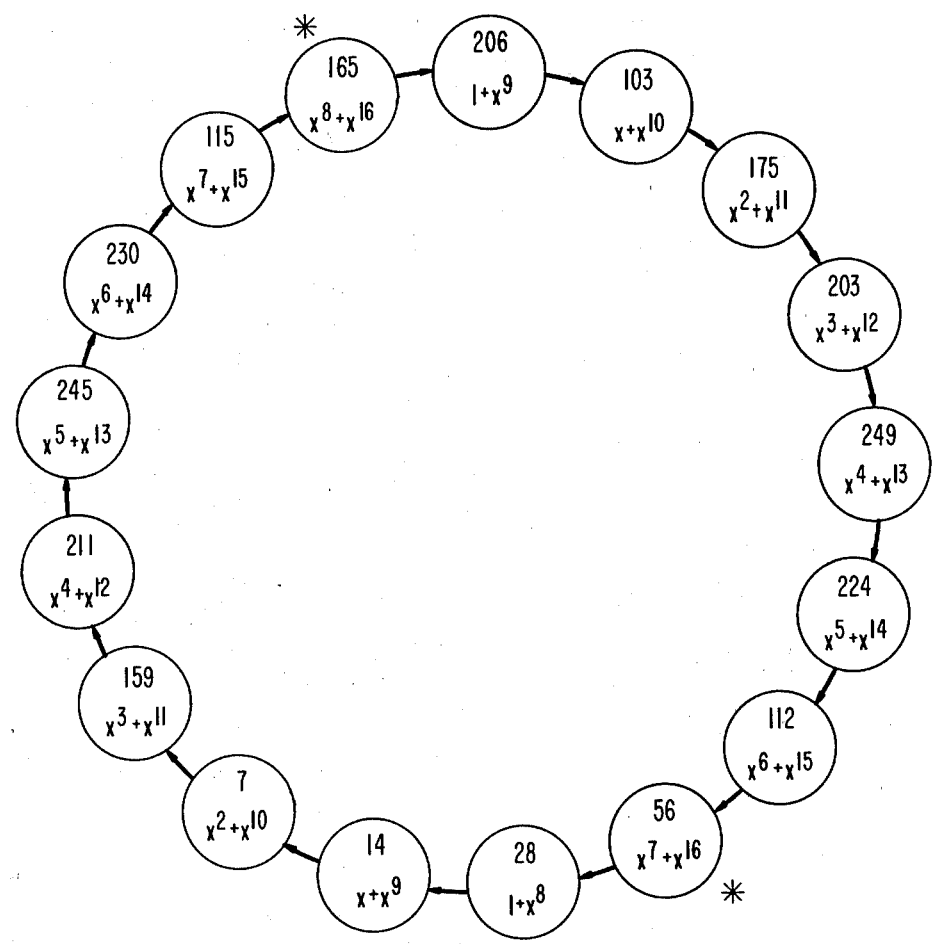
Figure 13:
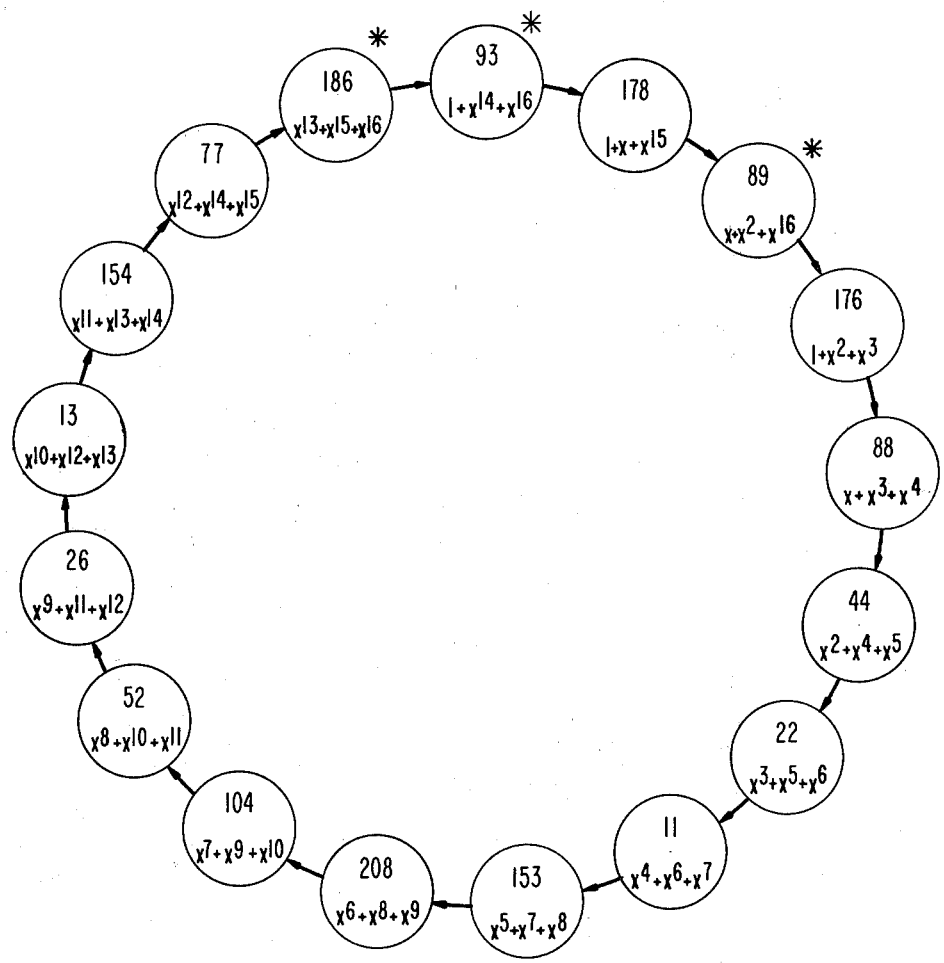
Figure 14:
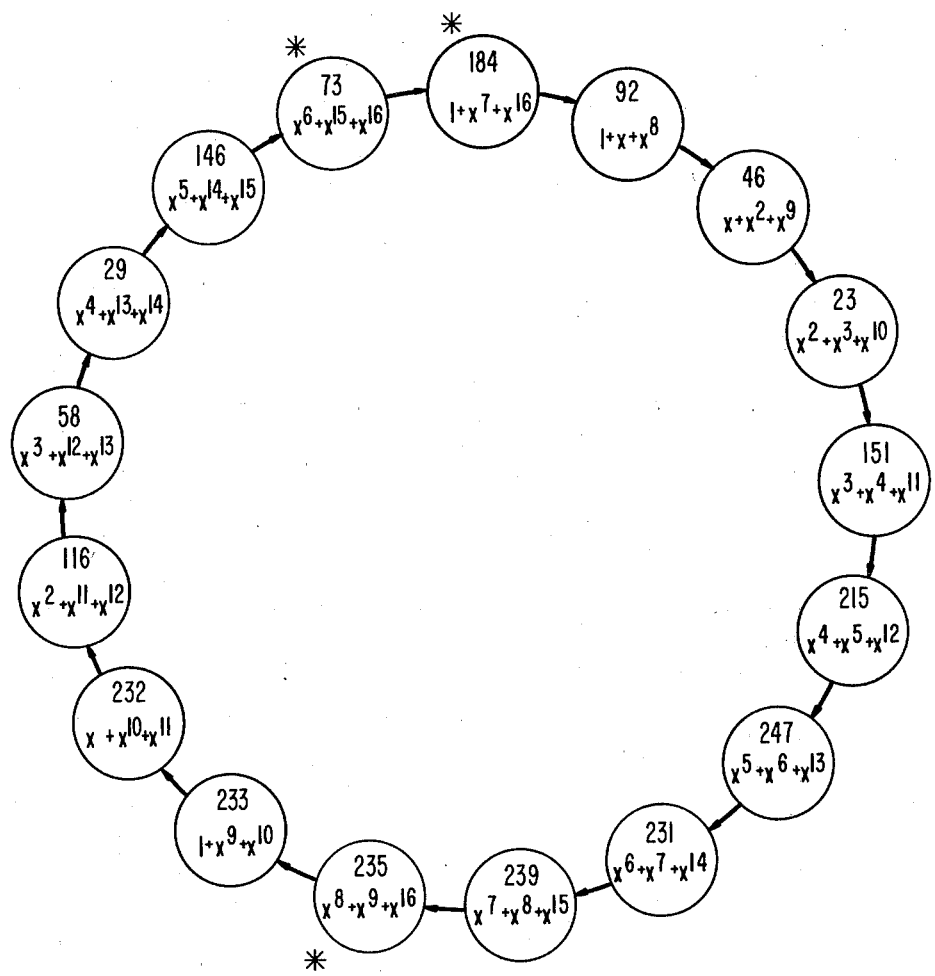
Figure 15:
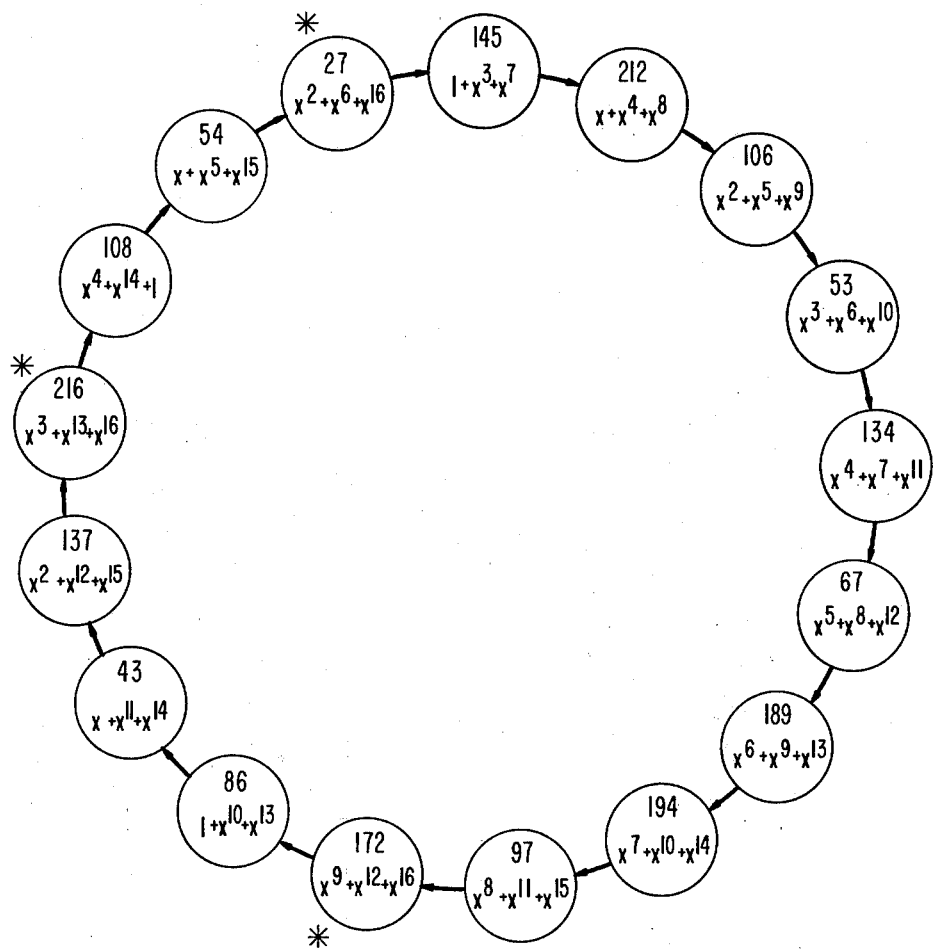
Figure 16:
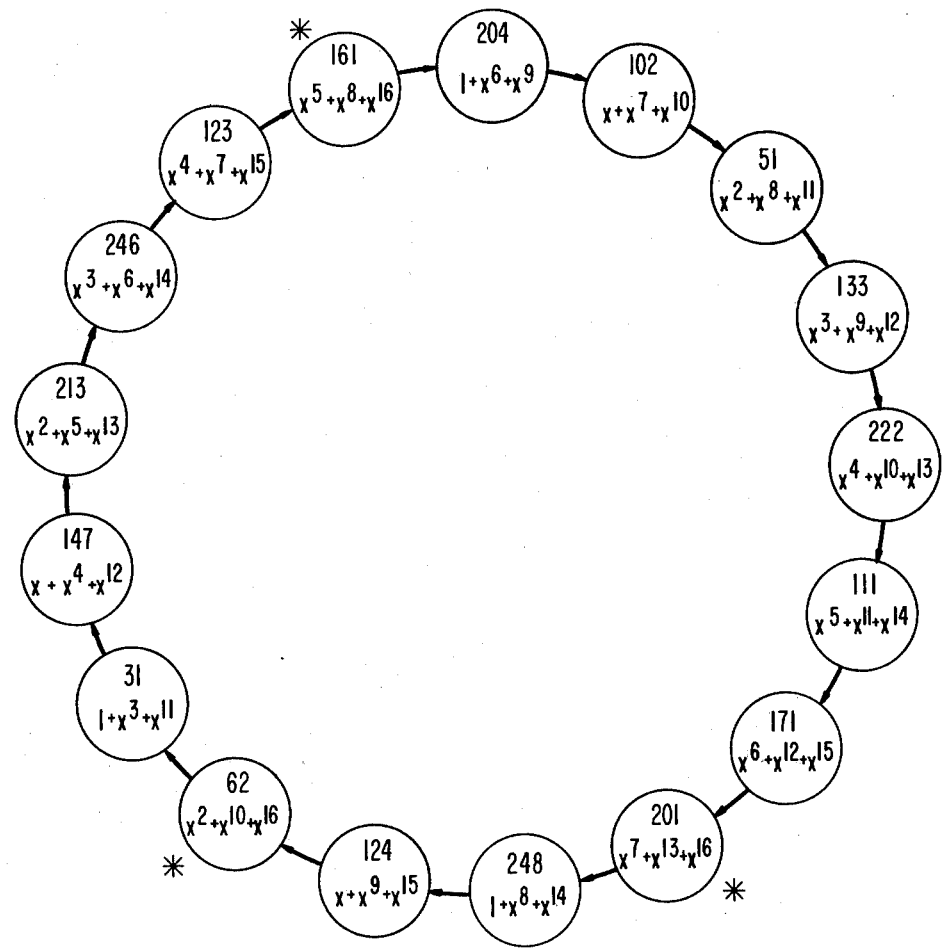
Figure 17:
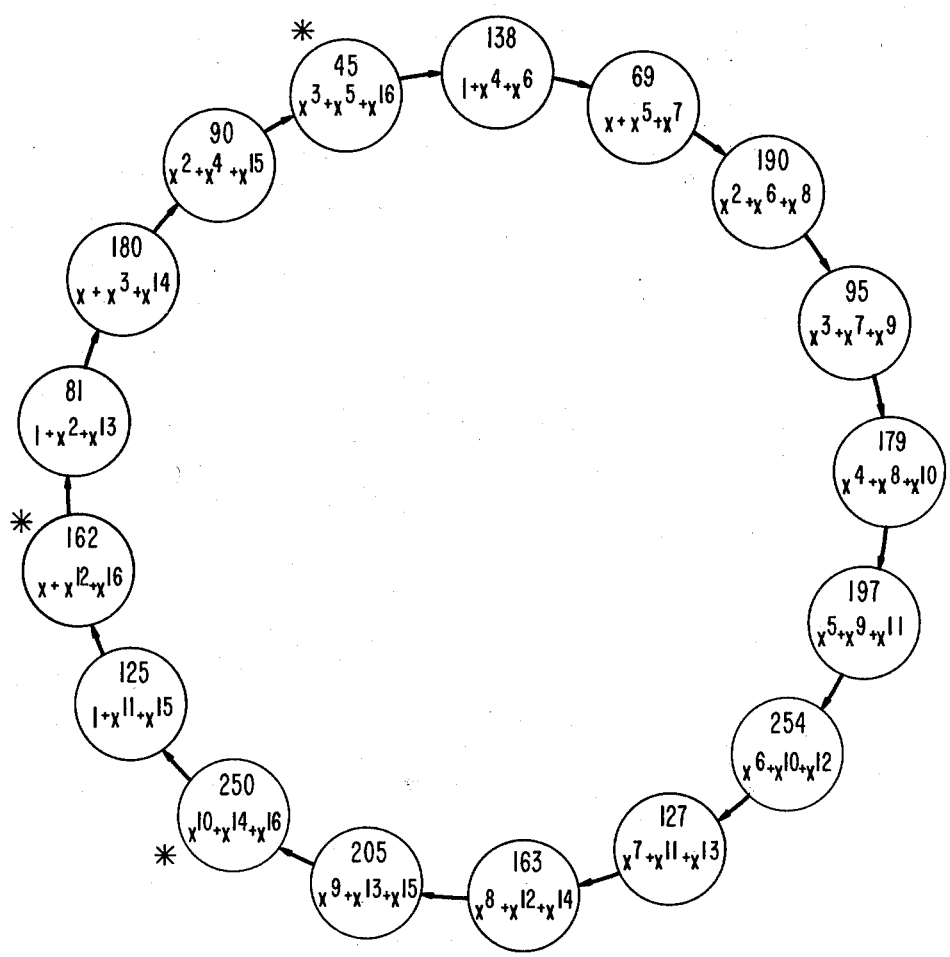
Figure 18:
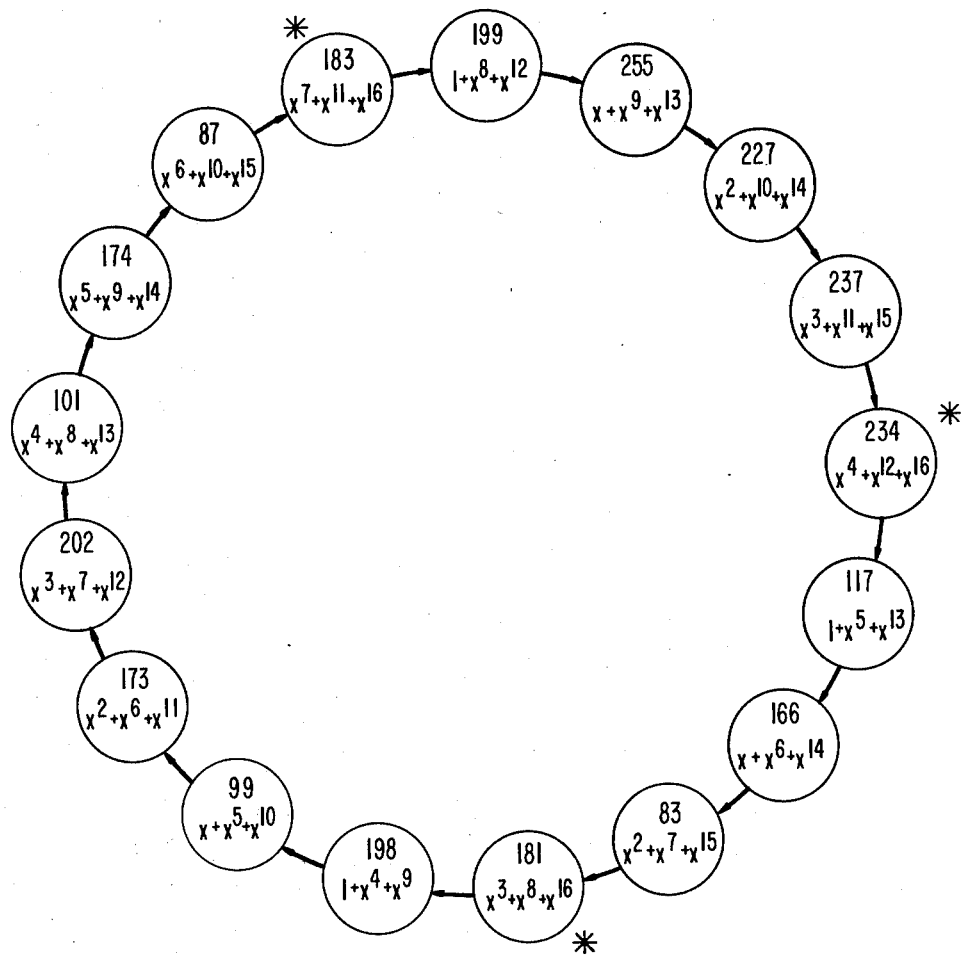

The output (s(x)) of the syndrome former 13 is delivered to the logic circuit 14, labeled $\delta_\xi^*(s(r_i(x)))$, which determines whether the last bit of the stored code word is in error or not and if so, whether we want to correct it. As shown in detail in FIG. 3, the logic circuit 14 comprises a plurality of NAND gates 31, 32. To simplify the drawing, and as was done in part in FIG. 2, airline connections from the gates 31 to the gate 32 are utilized. The circuit of FIG. 3 is of sufficient simplicity as to obviate detailed description; it is essentially self-explanatory. For other and different cyclic codes this logic circuit would, of course, be different—i.e., a different NAND gate configuration. However, once again, given the previous mathematical analysis it is within the skill of one in the art to design the requisite logic circuitry for other and different cyclic codes.

The decision of the logic circuit 14 is modulo-2 added (15) with the last stored bit, the output being the correct version of the last bit. If this last bit is in error it is corrected, and if there is no error it is unchanged. The storage register 12 is then clocked so that the output of the modulo-2 adder 15 (i.e., the correct version of the last bit) moves into the input stage of the register 12. The whole operation is repeated nt* times (or nt' for suboptimum decoding) at the end of which the maximum likelihood decision on r(x) is present in the storage register, ready to be read out.

For the assumed cyclic code, the length n of the code word is a prime number (17) and, therefore, there are exactly $(2^r - 1)/n = (2^8 - 1)/17 = 15$ syndrome chains (Theorem 8A). These chains are drawn out in FIGS. 4-18. Each circle on each of these figures contains a number and a polynomial. As indicated by the key diagram of FIG. 4, the number (N) is the syndrome in decimal form. If the syndrome s(x) is, $$s(x) = s_0 + s_1 x + s_2 x^2 + \ldots + s_7 x^7,$$

then, $$N = s_7 + 2s_6 + 2^2 s_5 + 2^3 s_4 + 2^4 s_3 + 2^5 s_2 + 2^6 s_1 + 2^7 s_0.$$

The polynomial p(x) is the error pattern εE that corresponds to the syndrome s(x). Also on each chain, certain circles are marked with a star (*). These correspond to those syndromes whose error pattern has degree=16.

At least one of the starred circle syndromes from each chain must be included in the set ξ*. Note that the single error chain (FIG. 4) has only one starred circle, the double error chains (FIGS. 5–12) have two starred circles each, and the triple error chains (FIGS. 13–18) have three starred circles each. Next observe that including more than one syndrome in a starred circle from the same chain in ξ* also leads to maximum likelihood decoding. This is readily verified by noting that Theorem 10 supra section still remains valid. This fact allows simplification of the logic required to build $\delta_\xi^*(s(r_i(x)))$ as, of the multiple starred circle syndrome choices for the same chain, $\delta_\xi^*(s(r_i(x)))$ can be made $=x^{n-1}$ on one of these syndromes and either $\emptyset$ or $x^{n-1}$ on the other(s). Thus, multiple choices for starred circle syndromes lead to "don't care" logic conditions and thus simplify logic.

The table of FIG. 19 lists the chain numbers, their starred circle syndromes and defines a possible choice of $\delta_\xi^*(s(r_i(x)))$ over the set of all starred circle syndromes. Note that at least one starred circle syndrome from each chain leads to $\delta_\xi^*(s(r_i(x))) = x^{n-1}$. For the (17, 9) cyclic code, a minimization of logic shows that $\delta_\xi^*(s(r_i(x)))$ can be built using only 8 NAND gates (FIG. 3).

For illustrative purposes, assume that the code word stored in register 12 contains two errors—four bits apart—and that the erroneous bits are initially deposited in the first and fifth stages of the register 12. The syndrome former 13 will generate the appropriate syndrome—136 in decimal—and deliver the same to the logic circuit 14. For this particular error condition (double error), the fifth syndrome chain is operative (see FIG. 8). However, since the last bit of the stored code word is not in error, no correction is called for and this last bit is simply clocked back into the input stage of register 12 via the modulo-2 adder 15. The stored (error) bits are simultaneously shifted one bit position, and the whole operation is repeated again, and again. The syndrome former generates the successive syndromes 136, 68, 34, 17, 148 . . . as the stored bits are successively shifted a bit position at a time. Finally, the last bit of the stored word will be one of the error bits, the syndrome former will then generate the appropriate syndrome (226 in decimal), the logic circuit in response thereto determines that the present last stored bit is in error and the appropriate binary signal is sent to the modulo-2 adder to correct the error. The corrected version of the last bit is then clocked into the input stage of the shift register. Hence, one of the two errors has been corrected.

With only a single error now in the stored code word, the first syndrome chain is operative (see FIG. 4). The storage register 12 is continually clocked and the syndrome former generates successive syndromes (e.g. 241, 228, 114), which are inoperative, until the error bit becomes the last bit of the stored code word. As shown in FIG. 4, when the last bit is in error the syndrome former generates the decimal 57 syndrome. In response to this input syndrome, the logic circuit 14 determines that the last bit is in fact erroneous and it sends the appropriate signal to the modulo-2 adder 15 to correct the error. The corrected version of the last bit is then clocked into the storage register, and both errors have thus been eliminated from the code word.

A relatively simple cyclic code with just two errors was chosen for purposes of explanation. For a more complex code, such as (63, 39), having multiple errors the decoding operation would be more involved. Nevertheless, the basics of the operation remain the same—i.e., successive chains of syndromes are formed to successively correct the error bit in the last bit position of the stored word.

Considering now one further example which particularly points out the distinct operation of the present invention, let it be assumed that the stored code word contains two errors—eight bits apart—and that the erroneous bits are initially deposited in the first and ninth stages of the storage register 12. The syndrome former 13 will generate the appropriate syndrome—28 in decimal—and deliver the same to logic circuit 14. For this particular error condition (double error), the ninth syndrome chain is operative (see FIG. 12). The last bit of this stored code word is not in error and therefore no correction is called for at this time. The syndrome former 13 generates the successive syndromes 28, 14, 7, 159, 211 . . . as the stored bits are successively shifted a bit position at a time. Finally, the last bit of the stored word will be one of the error bits. The syndrome former will then generate the appropriate syndrome (165 in decimal), but the logic circuit 14 in this case will not respond (unlike the Meggitt decoder) since this is a "don't care" condition (see table of FIG. 19) which is chosen to be a zero to achieve simpler circuitry for the logic 14. This error bit is therefore not corrected at this time. Further clocking of the storage register 12 eventually results in the other error bit being shifted into the last stage of register 12. The syndrome former 13 then generates the syndrome 56 (in decimal) and the logic circuit 14 responds thereto to send the appropriate signal to the modulo-2 adder 15 to correct the error. The corrected version of the last bit is then clocked into the register 12. Hence, one of the two errors has been corrected.

With only a single error now in the stored code word, the first syndrome chain is operative (see FIG. 4). The syndrome former then goes through the syndromes 1, 156, 78, 39 . . . , which are inoperative, until the error bit becomes the last bit of the stored code word. The syndrome former then generates the decimal 57 syndrome and the error bit is thus corrected as previously described.

It will be evident from the foregoing explanation that there are instances where the last bit of the stored word is in error, which syndrome former appropriately responds to, but the logic circuit 14 chooses to ignore (i.e., the "don't care" condition). This "don't care" alternative permits a considerable reduction in the complexity of the logic circuit 14. However, this does not mean that the error goes uncorrected. As the syndrome former 13 cycles through successive chains of syndromes all of the errors will ultimately be corrected.

The storage register 12 can be clocked at a very high rate (e.g., 10 to 100 megahertz). The only limiting factor is the delay encountered in the syndrome former 13, logic circuit 14 and adder 15. However, since the syndrome former 13 and logic 14 comprise simply a series of logic gates, which can be readily ICed, the total series delay through these gates will be measured in nanoseconds (e.g., 10 ns). Accordingly, a decoder in accordance with the invention operates in real-time.

That is, while a received code word is being read into register 11, the previous code word is corrected in storage register 12 in the manner described. And this corrective procedure will be carried out before the code word read-in to register 11 is completed.

The principles of the present invention are in general applicable to all cyclic codes as well as shortened cyclic codes. For example, the illustrative embodiment designed for the (17,9) cyclic code is equally useful in decoding the shortened (16,8) code.

It is to be understood that the foregoing disclosure is merely illustrative of the application of the principles of the present invention and numerous modifications or alterations may be devised by those skilled in the art without departing from the spirit and scope of the invention.

What is claimed is:

1. Apparatus for decoding cyclic codes that may incorporate one or more errors comprising first register means for receiving a cyclic code word, second register means for storing the code word received by the first register means, means for forming the syndrome of the code word stored in the second register means, means responsive to said syndrome for determining whether the last bit of the stored code word is in error, means for modulo-2 adding the output of the determining means with said last bit to provide a correct version of the last bit, means for shifting the output of the modulo-2 means into the input of the second register means, and means for repeating the correction operation a predetermined number of times at the end of which the maximum likely code word is present in the second register means, said forming means comprising means for forming successive syndrome chains of multiple syndromes each to correct errors in a received cyclic code word.

2. Apparatus as defined in claim 1 wherein the first and second register means respectively comprise first and second shift registers, and means for clocking the second shift register at a rate substantially greater than the clock rate of the first shift register.

3. Apparatus for decoding an (n,k) cyclic code as defined in claim 1 wherein the number of syndrome chains (J) is given by $J=(2^r-1)/n$, where $r \triangleq n-k$.

4. Apparatus as defined in claim 3 wherein the syndrome forming means and the determining means are each comprised of combinational gate logic.

5. Apparatus as defined in claim 4 wherein the syndrome former means comprises a plurality of exclusive-OR gates connected in a tree-like configuration.

6. Apparatus as defined in claim 4 for decoding the (17,9) cyclic code wherein the determining means consists of eight NAND gates.

7. A method for decoding cyclic codes comprising the steps of receiving an (n,k) cyclic code word, storing the received code word in a register, forming the syndrome of the stored code word, determining from the syndrome whether the last bit of the stored code word is in error, binarily adding the result of the determination with said last bit to provide a correct version of the last bit, shifting said correct version into the input of said register, and repeating the forming, determining, adding and shifting steps a predetermined number of times at the end of which the maximum likely code word will be present in the register, said forming step comprising forming successive syndrome chains of multiple syndromes each to correct errors in a received cyclic code word.

8. A method for decoding an (n,k) cyclic code as defined in claim 7 wherein the number of syndrome chains (J) is given by $J=(2^r-1)/n$, where $r \triangleq n-k$.

9. A method for decoding cyclic codes comprising the steps of (a) storing a received cyclic code vector r(x), where $r(x)=\hat{c}(x)+e^*(x)$, $\hat{c}(x)$ being the maximum likely code word and $e^*(x)$ the transmission error;

(b) initializing variable $i=-1$ and polynomial $r_0(x)=r(x)$, (c) incrementing $i=i+1$;

(d) forming polynomial $p(x)=s(f^i r(x))$, where $s(f^i r(x))$ is the syndrome of the received vector;

(e) determining $\delta_\xi^*(p(x))$ from the polynomial p(x) to indicate whether the last bit of the stored code vector is in error;

(f) forming $r_{i+1}(x) \triangleq r_i(x) \oplus \delta_\xi^*(p(x))$;

(g) checking if $i<t^*n$, where $t^*n$ is a predetermined number defined by the maximum error correcting capability of the code used, and if $i<t^*n$ repeating steps c, d, e and f or else proceeding to step h; and (h) setting $c(x)=r_{t^*n}(x)$, where $r_{t^*n}(x)$ is the maximum likely code word.

* * * * *